United States Patent
Shiozawa et al.

[11] Patent Number: 5,888,876
[45] Date of Patent: Mar. 30, 1999

[54] DEEP TRENCH FILLING METHOD USING SILICON FILM DEPOSITION AND SILICON MIGRATION

[75] Inventors: Jun-ichi Shiozawa, Wappingers Falls; Yoshitaka Tsunashima; Katsuya Okumura, both of Poughkeepsie, all of N.Y.

[73] Assignee: Kabushiki Kaisha Toshiba, Kawasaki, Japan

[21] Appl. No.: 628,094

[22] Filed: Apr. 9, 1996

[51] Int. Cl.$^6$ ............................... H01L 21/20; H01L 21/76
[52] U.S. Cl. ............................................. 438/386; 438/430
[58] Field of Search ................................... 438/243, 386, 438/430, 770

[56] References Cited

U.S. PATENT DOCUMENTS

| | | | |
|---|---|---|---|
| 4,104,086 | 8/1978 | Bondur et al. | 438/433 |
| 4,278,705 | 7/1981 | Agraz-Guerena et al. | 438/452 |
| 4,471,525 | 9/1984 | Sasaki | 438/431 |
| 4,571,819 | 2/1986 | Rogers et al. | 438/430 |
| 4,604,150 | 8/1986 | Lin | 438/392 |
| 4,656,497 | 4/1987 | Rogers et al. | 257/397 |
| 4,952,524 | 8/1990 | Lee et al. | 438/437 |
| 4,970,176 | 11/1990 | Tracy et al. | 438/660 |
| 4,977,104 | 12/1990 | Sawada et al. | 438/386 |
| 5,104,482 | 4/1992 | Monkowski et al. | 438/698 |
| 5,192,708 | 3/1993 | Beyer et al. | 438/361 |
| 5,270,244 | 12/1993 | Baliga | 438/440 |
| 5,310,698 | 5/1994 | Wild | 438/658 |
| 5,318,923 | 6/1994 | Park | 438/652 |
| 5,371,039 | 12/1994 | Oguro | 438/396 |
| 5,451,809 | 9/1995 | Shiozawa et al. | 438/386 |

*Primary Examiner*—Peter Toby Brown
*Assistant Examiner*—Toniae M. Thomas
*Attorney, Agent, or Firm*—Banner & Witcoff, Ltd.

[57] ABSTRACT

A method of filling one or more trenches formed in a silicon substrate includes the steps of forming a thin polycrystalline silicon film in a trench such that the thin polycrystalline silicon film is sufficiently thin so as to not close the trench; forming an amorphous silicon film on thin polycrystalline film and the surface of the substrate and in the trenches; and annealing the amorphous silicon film such that the amorphous silicon layer migrates to fill the trenches to a first level. The deposition and annealing steps are performed in ambient atmospheres having low partial pressures of $H_2O$ and $O_2$, the annealing temperature is higher than the deposition temperature, and the annealing pressure is greater than the deposition pressure.

11 Claims, 2 Drawing Sheets

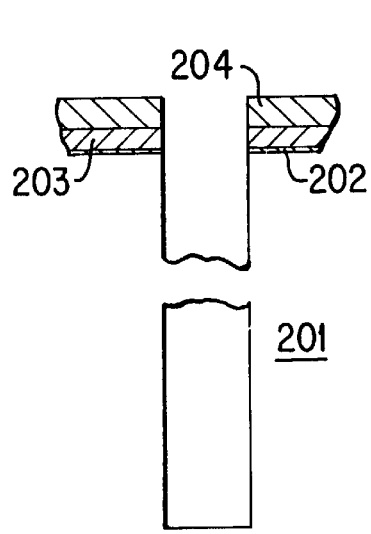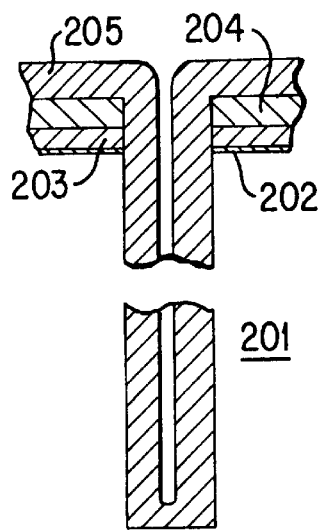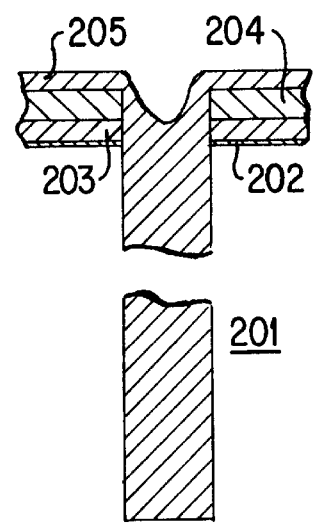
FIG. 2A  FIG. 2B  FIG. 2C
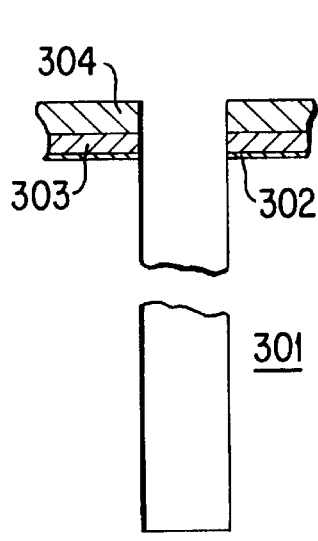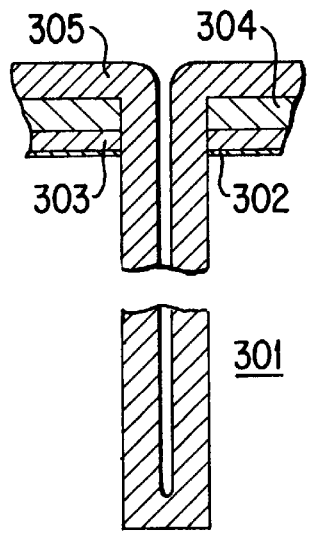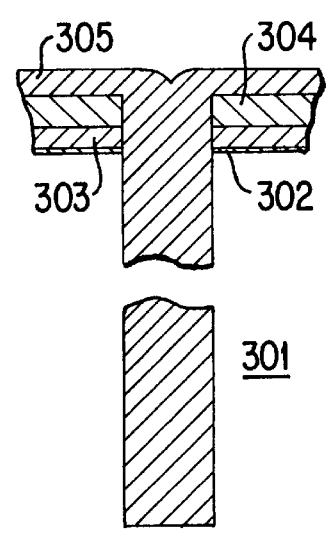
FIG. 3A  FIG. 3B  FIG. 3C

DEEP TRENCH FILLING METHOD USING SILICON FILM DEPOSITION AND SILICON MIGRATION

FIELD OF THE INVENTION

The present invention relates to a method of filling deep trenches formed in a silicon substrate by first depositing an amorphous silicon layer on the surface of the substrate and in each trench and then annealing the amorphous silicon layer to fill the trenches using a silicon migration process.

BACKGROUND OF THE INVENTION

During manufacture of semiconductor devices such as semiconductor memory devices, often a plurality of trenches are formed in the surface of a semiconductor substrate using, for example, reactive ion etching (RIE) or other known processes. The trenches are then filled with a silicon material. The silicon deposits in each trench form, for example, capacitors in a semiconductor memory device.

The filling of the trenches with silicon material must be performed so as to reduce, and ideally eliminate, voids and seams (gaps and other undesired openings) in the deep trench filling material.

According to known processing methods, silicon films are formed inside each deep trench using, for example, low pressure chemical vapor deposition. When the wafers are removed from the deposition furnaces, unintentional oxide films (e.g., native oxide films) are formed on the deposited silicon films due to exposure to the ambient atmosphere. Thus, subsequent annealing (to actuate dopants in the deposited silicon films, for example) is performed with unintentional oxide films on the silicon films. As a result, the known process results in numerous voids and seams in the trench filling material.

These voids and seams result in preferential etching during recess etching of the trench filling material during subsequent manufacturing steps. Furthermore, such voids and seams cause dislocations in the silicon substrate during oxidation processes performed after recess etching steps. Preferential etching and/or dislocation may result in such flaws as contact isolation or increases in node resistance. As a result, seams and voids formed in the trench filling material result in a lesser quality of performance of the semiconductor device.

Thus, there is a need for a deep trench filling method by which such voids and seams in the trench filling materials are greatly reduced or eliminated.

SUMMARY OF THE INVENTION

In view of the above drawbacks, a deep trench filling method using silicon film deposition and silicon migration according to the present invention enables filling of deep trenches in a semiconductor substrate with substantially fewer or no voids and seams in the trench filling material.

In the method according to the present invention, a doped amorphous silicon film (for example, a silicon film doped with arsenic or phosphorus atoms) is formed in the trench and on the surface of the substrate using a CVD or sputtering process. This silicon film does not completely fill the trench. The deposition temperature and pressure during this process are important to insure a very low oxygen level in the silicon layer. Subsequently, the amorphous silicon film is annealed, causing the amorphous silicon film to migrate into and within each trench, thereby filling each trench with silicon material. Notably, the silicon migration process only occurs if there is substantially no silicon oxide on the on the silicon film formed in the trench such that there is minimal surface energy between the migrating silicon and the silicon film already in the trench. Therefore, the pressure at which the annealing is performed and the annealing ambient environment are also important.

A method according to the present invention includes the steps of forming a thin polycrystalline silicon film in a trench, the thin polycrystalline silicon film being sufficiently thin so as to not close the trench; forming an amorphous silicon film on the thin polycrystalline film and the surface of the substrate and in the trenches such that the deep trenches are not completely filled with silicon; and annealing the amorphous silicon film such that the amorphous silicon layer migrates into and within the trench, filling the trench to a first level. The deposition and annealing steps are performed in ambient atmospheres having low partial pressures of $H_2O$ and $O_2$. The annealing temperature is preferably higher than the deposition temperature, and the annealing pressure is preferably greater than the deposition pressure.

Another method of filling one or more trenches formed in a silicon substrate according to the present invention includes the steps of depositing an amorphous silicon film on the surface of the silicon substrate and in the one or more trenches such that the trenches are not completely filled with silicon; and annealing the amorphous silicon film such that the amorphous silicon layer migrates into the trench, filling the trench to a first level. The deposition and annealing steps are performed in ambient atmospheres having low partial pressures of $H_2O$ and $O_2$, the annealing temperature is preferably higher than the deposition temperature, and the annealing pressure is preferably greater than the deposition pressure.

A third method according to the present invention includes the steps of depositing an amorphous silicon film on the surface of the silicon substrate and in the one or more trenches, wherein the amorphous silicon film seals the trenches. The deposition process is performed at a first ambient pressure. This method also includes the step of annealing the amorphous silicon film such that the amorphous silicon layer migrates into any openings in the trenches. The annealing step is performed at a second ambient pressure greater than the first ambient pressure such that the amorphous silicon layer migrates into the openings in the trenches as a result of the pressure differential between the pressure in the openings (the first ambient pressure) and the second ambient pressure. The deposition and annealing steps are performed in ambient atmospheres having low partial pressures of $H_2O$ and $O_2$, and the annealing temperature is higher than the deposition temperature.

Various additional advantages and features of novelty which characterize the invention are further pointed out in the claims that follow. However, for a better understanding of the invention and its advantages, reference should be made to the accompanying drawings and descriptive matter which illustrate and describe preferred embodiments of the invention.

BRIEF DESCRIPTION OF THE DRAWINGS

FIGS. 2A–2C provide an illustration of a second method of deep trench filling according to the present invention.

FIGS. 3A–3C provide an illustration of a third method of deep trench filling according to the present invention.

DETAILED DESCRIPTION

The deep trench filling method according to the present invention will now be described in detail with reference to the accompanying drawings.

With reference to FIGS. 1A to 1D, a deep trench filling method is illustrated in which seams and voids, in particular, seams and voids in the bottom portion of the trench fill, are eliminated or greatly reduced. This process includes a step of depositing an amorphous silicon film and a step of annealing the deposited silicon film such that the film migrates into and within the trenches to fill the trenches, forming minimal or no voids or seams. As a result, silicon atom migration is used to achieve filling of the trenches. This method will now be described in further detail.

Figure 1A:
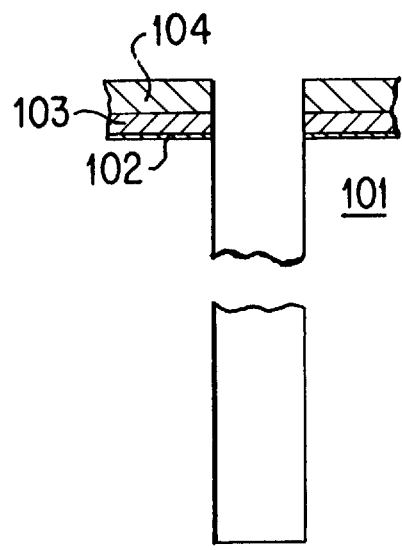
FIGS. 1A–1D provide an illustration of a first method of deep trench filling according to the present invention.

In FIG. 1A, a deep trench is formed in a surface of a silicon substrate 101 using reactive ion etching (RIE). During this etching process, a silicon dioxide layer 102 (pad oxide), a silicon nitride layer 103 (pad SiN), and a silicon dioxide layer 104 (pad TEOS) are used to mask the surface of the substrate.

Figure 1B:
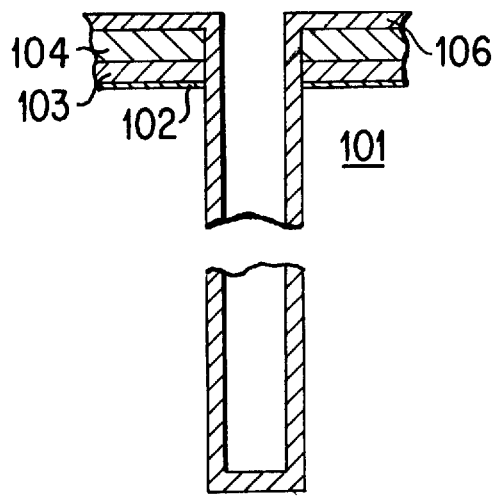

Next, as shown in FIG. 1B, a thin polycrystalline silicon layer 106 is deposited or grown in the trench and on the surface of the substrate 101. This film is sufficiently thin so as to not close the trench. For example, the polysilicon layer 106 may have a thickness of approximately 200 Å and be deposited using a CVD process at approximately 623° C.

Figure 1C:
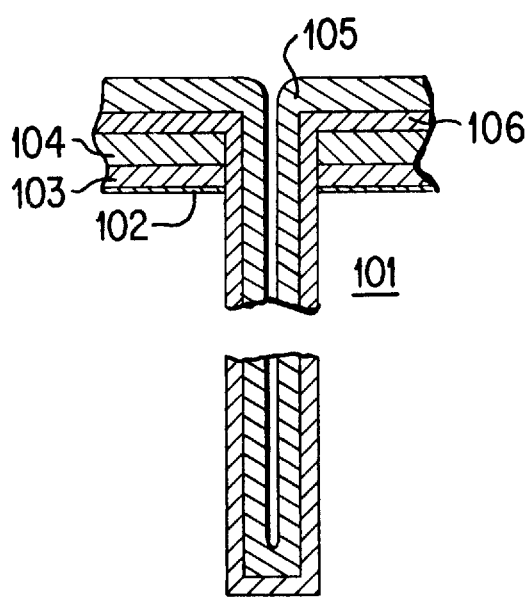

Then, as shown in FIG. 1C, an amorphous silicon layer 105 having a thickness of approximately 1000 Å to 2500 Å is deposited or grown on the surface of the substrate 101 and in the trenches using a known CVD or sputtering process. At this stage of the process, the deep trenches are not completely filled with silicon.

According to one method of the present invention, a CVD process is used to deposit silicon layer 105 in which $SiH_4$ or $SIH_6$ is used as a gas source, deposition temperature ranges from 450° C. to 550° C., and deposition gas pressure ranges from 0.1 Torr to 100 Torr. The $H_2O$ and $O_2$ partial pressures of the deposition ambient gas are, for example, less than $10^{-6}$ Torr. This lower partial pressure results in a very low oxygen concentration in the amorphous silicon layer 105, e.g., less than $10^{18}$ cm$^{-3}$. The lower oxygen concentration is necessary for silicon migration in the subsequent annealing step. The amorphous silicon layer 105 may also contain phosphorous, arsenic or boron atoms since this film is used as a gate conductor material. The silicon layer 105 may also be formed using a sputtering process under similar conditions.

Figure 1D:
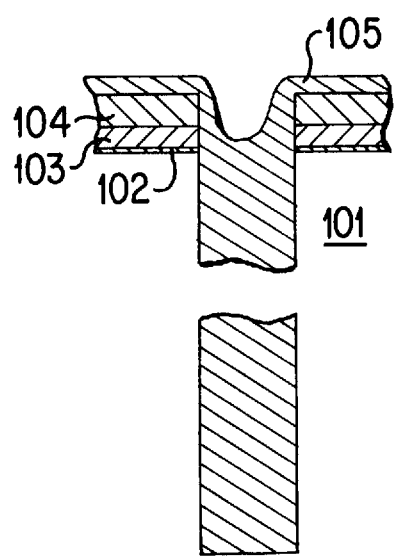

As shown in FIG. 1D, after the amorphous silicon layer 105 is deposited, annealing is carried out at a temperature which is preferably higher than the deposition temperature, such that the silicon layer flows or migrates into and within the trench. For example, an annealing temperature range of 600° C. to 1100° C. and an oxygen-less annealing ambient of Argon (Ar) or Nitrogen ($N_2$) at approximately 763 Torr may be used. The polycrystalline silicon layer 106 acts as a glue or adhesive layer which prevents undesired flow of silicon atoms from the walls of the trenches during annealing. The resulting silicon trench fill, particularly the bottom portion of the trench fill, has very few or no seams and voids, thereby improving the performance of the semiconductor device.

During the annealing step of the method according to the present invention, the processing chamber must be monitored to insure that the partial pressures of $H_2O$ and $O_2$ in the chamber remain less than $10^{-6}$ Torr. These substances may result from leaks into the chamber from the outside (the result of a faulty chamber seal) or contaminants on the walls of the processing chamber. If the partial pressure of either substance rises above $10^{-6}$ Torr, the chamber must be resealed or cleaned accordingly.

Under these conditions, no silicon oxide (which hinders migration of the amorphous silicon layer 105) is formed on the amorphous silicon film 105 during annealing. As a result, silicon migration into and within the trenches occurs during annealing. Each deep trench is filled to a level with silicon by this silicon mass flow, resulting in a low surface energy between the silicon films. The low surface energy between the films results in a trench fill with no seams or voids.

If nitrogen is used as the ambient during the annealing process, the process must be monitored to avoid nitridization which inhibits the silicon migration into the trenches.

During annealing, some volume reduction of the amorphous silicon layer 105 will occur. This reduction should be considered in determining the thickness of the silicon layer 105 which must be deposited in order to provide sufficient silicon to adequately fill the trenches.

In the preferred embodiment of the method according to the present invention, the annealing temperature is higher than the deposition temperature, and the annealing pressure is greater than the deposition pressure.

The above-described trench filling technique may be incorporated into a process for manufacturing a dynamic random access memory (DRAM) device. One such device is described in, for example, Nesbit et al., "A 0.6μm$^2$ 256 Mb Trench DRAM Cell With Self-Aligning Buried Strap (BEST)," I.E.D.M. 93-627-630.

A second deep trench filling method according to the present invention is illustrated in FIGS. 2A–2C. In FIG. 2A, a deep trench is formed in a surface of a silicon substrate 201 using reactive ion etching (RIE). During this etching process, a silicon dioxide layer 202 (pad oxide), a silicon nitride layer 203 (pad SiN), and a silicon dioxide layer 204 (pad TEOS) are used to mask the surface of the substrate using known methods.

Then, as shown in FIG. 2B, an amorphous silicon film 205 is formed on the surface of the substrate 201 and in the trenches using a known CVD or sputtering process as described above with reference to FIG. 1C. After the deposition of the amorphous silicon layer 205, the deep trenches are not yet completely filled with silicon.

Finally, as shown in FIG. 2C, after the amorphous silicon layer 205 is deposited, annealing is carried out at a higher temperature than the deposition temperature as described above with reference to FIG. 1D, such that the silicon layer migrates into and within the trench. The resulting silicon trench filling has reduced seams and voids.

A third deep trench filling method according to the present invention is illustrated in FIGS. 3A–3C. In FIG. 3A, a deep trench is formed in a surface of a silicon substrate 301 using reactive ion etching (RIE). During this etching process, a silicon dioxide layer 302 (pad oxide), a silicon nitride layer 303 (pad SiN), and a silicon dioxide layer 304 (pad TEOS) are used to mask the surface of the substrate.

As shown in FIG. 3B, an amorphous silicon film 305 is deposited on the surface of the substrate 301 and in the trenches using a known CVD or sputtering process as described above with reference to FIG. 1C. The top of the trench is closed with the amorphous silicon film 305, and seams and voids remain at the bottom of the trench.

Then, as shown in FIG. 3C, annealing is carried out at a higher pressure than the deposition pressure as described above with reference to FIG. 1D. During this annealing process, the silicon atoms migrate to the voids and seams due to the force of the pressure difference between the pressure in the voids and seams (substantially equal to the deposition pressure) and the ambient annealing pressure. In this method, the $H_2O$ and $O_2$ partial pressures in the processing chamber must be monitored so that they remain less than $10^{-6}$ Torr to prevent the formation of oxide which inhibits the silicon migration into the trenches. The resulting silicon trench filling has reduced seams and voids, thereby optimizing the performance of the semiconductor device.

Notably, the filling method by silicon migration according to the present invention may also be used to fill contact regions or other suitable areas formed in the surface of a silicon substrate using similar processing steps.

While the present invention has been particularly described with reference to the preferred embodiments, it should be readily apparent to those of ordinary skill in the art that changes and modifications in form and details may be made without departing from the spirit and scope of the invention. It is intended that the appended claims include such changes and modifications.

We claim:

1. A method of filling one or more trenches formed in a silicon substrate, comprising the steps of:

forming a thin polycrystalline silicon film in a trench, said thin polycrystalline silicon film being sufficiently thin so as to not close the trench;

forming an amorphous silicon film on said thin polycrystalline silicon film and the surface of the substrate and in the trenches; and annealing the amorphous silicon film such that the amorphous silicon layer migrates to fill the trenches to a first level, wherein said deposition and annealing steps are performed in ambient atmospheres having low partial pressures of $H_2O$ and $O_2$.

2. A method according to claim 1, wherein the annealing temperature is higher than the deposition temperature.

3. A method according to claim 1, wherein the annealing pressure is greater than the deposition pressure.

4. A method according to claim 1, wherein said partial pressures of $H_2O$ and $O_2$ are less than $10^{-6}$ Torr.

5. A method according to claim 1, wherein said annealing temperature is in a range of 600° C. to 1100° C. and said deposition temperature is in a range of 450° C. to 550° C.

6. A method of filling one or more trenches formed in a silicon substrate, comprising the steps of:

depositing an amorphous silicon film on the surface of the silicon substrate and in the one or more trenches; and annealing the amorphous silicon film such that the amorphous silicon layer migrates to fill the trenches to a first level, wherein said deposition and annealing steps are performed in ambient atmospheres having low partial pressures of $H_2O$ and $O_2$, the annealing temperature is higher than the deposition temperature, and the annealing pressure is greater than the deposition pressure.

7. A method according to claim 6, wherein said partial pressures of $H_2O$ and $O_2$ are less than $10^{-6}$ Torr.

8. A method according to claim 6, wherein said annealing temperature is in a range of 600° C. to 1100° C. and said deposition temperature is in a range of 450° C. to 550° C.

9. A method of filling one or more trenches formed in a silicon substrate, comprising the steps of:

depositing an amorphous silicon film on the surface of the silicon substrate and in the one or more trenches, said amorphous silicon film sealing the one or more trenches, wherein said deposition process performed at a first ambient pressure; and annealing the amorphous silicon film such that the amorphous silicon layer migrates into any openings in the trenches, said annealing step performed at a second ambient pressure greater than said first ambient pressure, said amorphous silicon layer migrating into the openings in the trenches as a result of the pressure differential between the pressure in the openings and the second ambient pressure, wherein said deposition and annealing steps are performed in ambient atmospheres having low partial pressures of $H_2O$ and $O_2$, the annealing temperature is higher than the deposition temperature.

10. A method according to claim 9, wherein said partial pressures of $H_2O$ and $O_2$ are less than $10^{-6}$ Torr.

11. A method according to claim 9, wherein said annealing temperature is in a range of 600° C. to 1100° C. and said deposition temperature is in a range of 450° C. to 550° C.

* * * * *